(12) United States Patent
Kim et al.

(10) Patent No.: US 9,076,942 B2
(45) Date of Patent: Jul. 7, 2015

(54) LIGHTING DEVICE AND LIGHTING SYSTEM HAVING THE SAME

(75) Inventors: Kyong Jun Kim, Seoul (KR); Sung Ho Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 305 days.

(21) Appl. No.: 13/075,405

(22) Filed: Mar. 30, 2011

(65) Prior Publication Data

US 2011/0242825 A1 Oct. 6, 2011

(30) Foreign Application Priority Data

Apr. 1, 2010 (KR) .................... 10-2010-0029941

(51) Int. Cl.
*B60Q 3/04* (2006.01)
*H01L 33/62* (2010.01)
*H01L 33/48* (2010.01)

(52) U.S. Cl.
CPC .............. *H01L 33/62* (2013.01); *H01L 33/486* (2013.01); *H01L 2224/48091* (2013.01); *H01L 2224/48247* (2013.01); *H01L 2924/15747* (2013.01)

(58) Field of Classification Search
CPC ........... H01L 2224/48091; H01L 2924/15747; H01L 2924/00; H01L 2924/00014
USPC .......... 362/362, 382, 311.02, 311.06, 311.07, 362/311.08, 311.09, 311.1
See application file for complete search history.

(56) References Cited

U.S. PATENT DOCUMENTS

| | | | |
|---|---|---|---|
| 7,655,958 B2 | 2/2010 | Sanmyo | |
| 7,932,525 B2 | 4/2011 | Osamu | |
| 7,982,825 B2 | 7/2011 | Kim et al. | |
| 2004/0159850 A1 | 8/2004 | Takenaka | |
| 2008/0296592 A1 | 12/2008 | Osamu | |
| 2010/0001308 A1* | 1/2010 | Park et al. | 257/99 |
| 2010/0133565 A1* | 6/2010 | Cho et al. | 257/98 |

FOREIGN PATENT DOCUMENTS

| | | |
|---|---|---|
| CN | 101029993 A | 9/2007 |
| CN | 101315963 A | 12/2008 |
| CN | 201344485 Y | 11/2009 |
| JP | 2003-152228 A | 5/2003 |
| JP | 2005-116937 A | 4/2005 |
| JP | 2007-142044 A | 6/2007 |
| JP | 2007-184534 A | 7/2007 |
| JP | 2008-300386 A | 12/2008 |
| KR | 10-2004-0074613 A | 8/2004 |

* cited by examiner

*Primary Examiner* — Anh Mai
*Assistant Examiner* — Jessica M Apenteng
(74) *Attorney, Agent, or Firm* — Birch, Stewart, Kolasch & Birch, LLP (57) ABSTRACT

Provided are a lighting device and a lighting system having the same. The lighting device includes a board having a recess, a lead frame disposed in the recess and including a first lead frame protrusion protruding upward, and a light emitting device disposed on the lead frame.

20 Claims, 11 Drawing Sheets

LIGHTING DEVICE AND LIGHTING SYSTEM HAVING THE SAME

The present application claims priority under 35 U.S.C. 119 to Korean Patent Application No. 10-2010-0029941 filed Apr. 1, 2010, which is hereby incorporated by reference in its entirety.

BACKGROUND

Embodiments relate to a lighting device and a lighting system having the same.

Light emitting diodes (LED) are semiconductor devices that can realize light sources having various colors using GaAs-based, AlGaAs-based, GaN-based, InGaN-based, and AlGaInP-based compound semiconductor materials.

Characteristics of such an LED may be determined according to compound semiconductor materials used in the LED, colors, brightness, intensities of brightness, etc. Also, the LED is packaged and is being used as a light source in various fields, for example, on/off indicators displaying colors, character display devices, image display devices, etc.

SUMMARY

Embodiments provide a lighting device having an improved heat dissipation characteristic using a lead frame and a lighting system having the same.

Embodiments also provide a lighting device in which at least one frame of lead frames protrudes inside a board to effectively dissipate heat generated in a light emitting device and a lighting system having the same.

Embodiments also provide a lighting device in which at least one frame of lead frames protrudes toward a recess or a resin material to effectively dissipate heat generated in a light emitting device and a lighting system having the same.

In one embodiment, a lighting device comprises: a board having a recess; a lead frame disposed in the recess and comprising a first lead frame protrusion protruding upward; and a light emitting device disposed on the lead frame.

In another embodiment, a lighting device comprises: a board; a light emitting device disposed on the board; and a lead frame electrically connected to the light emitting device, wherein the lead frame comprises a first lead frame protrusion protruding upward and a second lead frame protrusion, in which a portion thereof is inserted into the board, exposed to the outside of the board to extend downward.

In further another embodiment, a lighting system comprises: a case; a light emitting module disposed in the case and comprising at least one lighting device; and a connection terminal disposed in the case and receiving a power from an external power source, wherein the lighting device comprises a board having a recess; a lead frame disposed in the recess and comprising a first lead frame protrusion protruding upward; and a light emitting device disposed on the lead frame.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on' a layer (or film), a region, a pad, or patterns, it can be directly on another layer, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, exemplary embodiments will be described with reference to the accompanying drawings.

Figure 1:
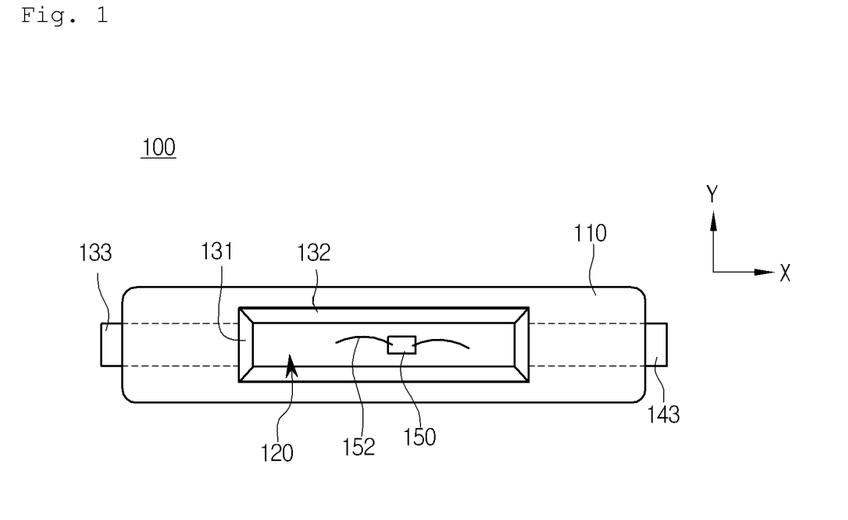
FIG. 1 is a view of a lighting device according to a first embodiment.
Figure 2:
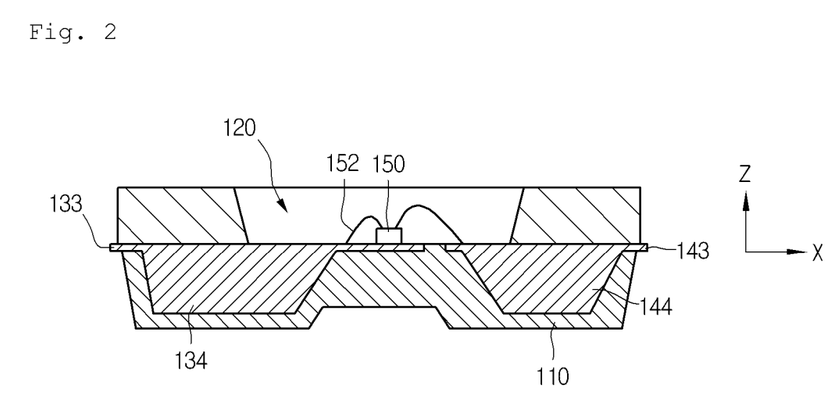
FIG. 2 is a sectional view of the lighting device of FIG. 1.
Figure 3:
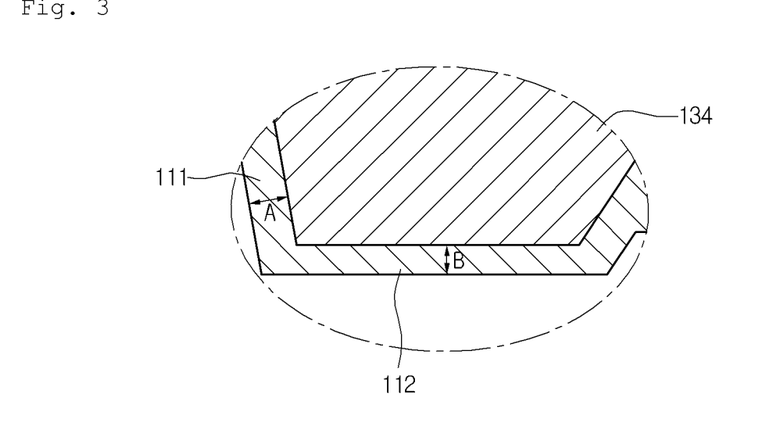
FIG. 3 is an enlarged view illustrating portions of a lead frame and a board illustrated in FIG. 2.

FIG. 1 is a view of a lighting device according to a first embodiment. FIG. 2 is a sectional view of the lighting device along an X-axis of FIG. 1. FIG. 3 is an enlarged view illustrating portions of a lead frame and a board illustrated in FIG. 2.

A lighting device 100 may be classified into a lateral type lighting device and a vertical type lighting device. The lighting device 100 may have various shapes such as a rectangular parallelepiped shape and a cube shape. The lighting device 100 can be used as light unit for backlight of liquid crystal display device and lighting system, etc. Hereinafter, for convenience of description, the lateral type lighting device will be described as an example.

The lighting device 100 comprises a board 110 having a recess 120, lead frames 133 and 143, and a light emitting device 150.

The board 110 may be formed of one of poly phthal amide (PPA), poly amide 9T (PA9T), liquid crystal polymer (LCP), and syndiotactic polystyrene (SPS). Also, the board 110 may be a printed circuit board (PCB).

The board 110 has the recess 120 having a predetermined depth on a top surface thereof. However, according to another embodiment, the recess 120 may not be defined.

Here, a first direction of the board 110 is referred to as an X-axis direction, and a second direction of the board 110 is referred to as a Y-axis direction. A length of the board 110 in the x-axis direction may be greater than a width of the board 110 in the Y-axis direction. However, the present disclosure is not limited to the shape of the board 110.

The lead frames 133 and 143 may be formed on a top surface of the board 110 through injection molding. The lead frames 133 and 143 may be disposed within the board 110. Portions of the lead frames 133 and 143 may be exposed from the recess 120.

As shown in FIG. 2, the lead frames 133 and 143 may comprise lead frame protrusions 134 and 144 protruding toward the inside (Z-axis downward direction) of the board 110, respectively. That is, the lead frame protrusions 134 and 144 for increasing heat dissipation areas of the lead frames 133 and 143 formed of a metal material are disposed to improve dissipation of heat generated from the light emitting device 150.

As shown in FIG. 3, each of the lead frame protrusions 134 and 144 may be disposed in consideration of a distance spaced from the board 110. That is, the first lead frame protrusion 134 of the lead frame protrusions 134 and 144 may be disposed to maintain a predetermined distance or more from a side part 111 and/or a bottom part 112 of the board 110.

For example, the first lead frame protrusion 134 may be spaced from the side part 111 and the bottom part 112 of the board 110 by a distance of about 50 μm to about 100 μm. When the distance is less than about 50 μm, moisture may be permeated into the lead frames 133 and 143 from the outside (specifically, from a downward direction).

If it is assumed that a distance between the first lead frame protrusion 134 and the side part 111 of the board 110 is referred to as a reference symbol A and a distance between the first lead frame protrusion 134 and the bottom part 112 of the board 110 is referred to as a reference symbol B, each of the reference symbols A and B being greater than about 50 μm may be useful.

The lead frames 133 and 143 and the lead frame protrusions 134 and 144 may be formed of the same metal material as each other. For example, the lead frames 133 and 143 and the lead frame protrusions 134 and 144 may be formed of one of metals such as Fe, Sn, Cr, Zn, Ni, Al, Ag, Au, Cu, and combinations thereof.

Left/right side surfaces 131 in the X-axis direction and top/bottom surfaces 132 of the recess 120 may constitute a portion of the board 110. Also, each of the left/right side surfaces 131 and top/bottom surfaces 132 of the recess 120 may be inclined at a predetermined angle. In this case, the inclined shape may be illustrated as shown in FIG. 1.

The light emitting device 150 may be provided on the lead frames 133 and 143 disposed in the recess 120 and connected to the lead frames 133 and 143 using wires 152. Also, the light emitting device 150 may be provided on the plurality of lead frames 133 and 143 through wire bonding, flip bonding, or die bonding. The light emitting device 150 may be disposed on the board 110 and electrically connected to the lead frames 133 and 143.

Also, the light emitting device 150 may comprise at least one or more LED chips of AlGaN-based, GaN-based, InGaAlP-based, GaAs-based LED chips formed of a group III-V element compound semiconductor. Also, a protection device such as a Zener diode may be provided to protect the light emitting device 150.

The lighting device 100 may be realized by a blue LED chip and a white light emitting device using a yellow phosphor (e.g., a silicate-based phosphor), an orange phosphor, a green phosphor, and a red phosphor according to its realization configuration. Also, the lighting device 100 may be realized as a light source by at least one or more combinations of a red LED chip, a green LED chip, a blue LED chip, a yellow LED chip, a yellow green LED chip, and an UV LED chip.

A resin material may be molded in the recess 120 to protect the light emitting device 150. The resin material may be formed using transparent epoxy or silicone. Alternatively, as necessary, a resin material containing phosphor powder may be molded in the recess 120. Molding solution or additives may be selectively used as the resin material according to purposes for use, use environment, and characteristics of products. Also, a surface of the resin material may have one shape of a flat shape, a concave lens shape, and a convex lens shape.

Figure 4:
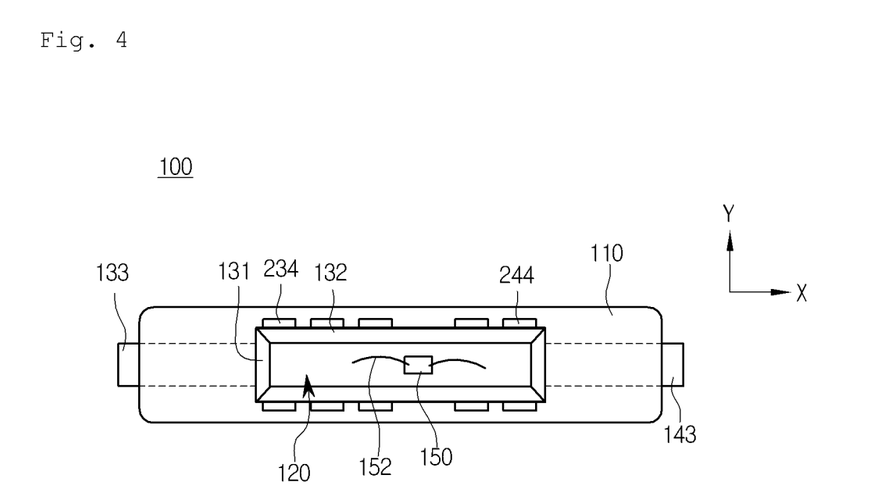
FIG. 4 is a view of a lighting device according to a second embodiment.
Figure 5:
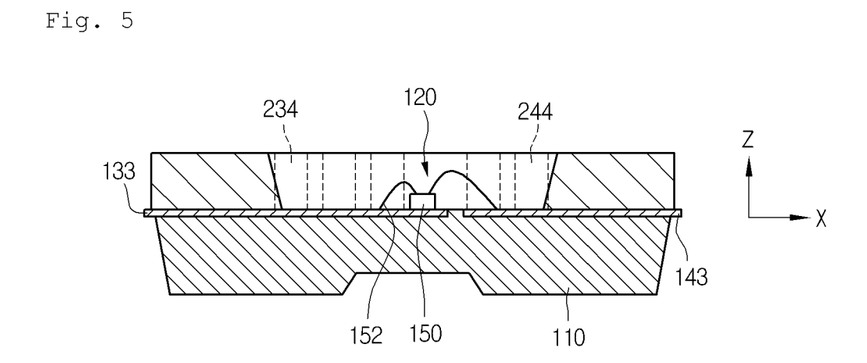
FIG. 5 is a sectional view of the lighting device of FIG. 4.
Figure 6:
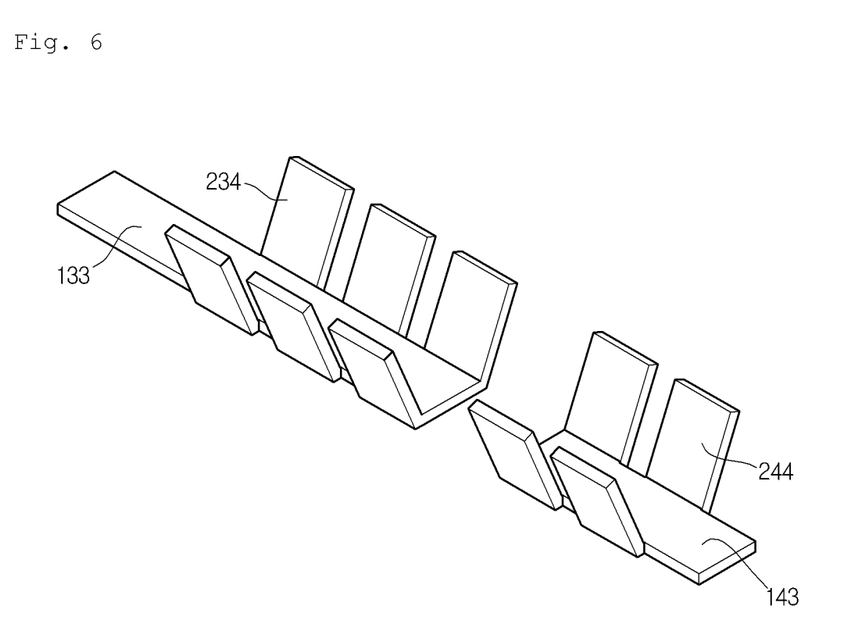
FIG. 6 is a perspective view of a lead frame illustrated in FIGS. 4 and 5.

FIG. 4 is a view of a light emitting device according to a second embodiment. FIG. 5 is a sectional view of the lighting device along the X-axis of FIG. 4. FIG. 6 is a perspective view of a lead frame illustrated in FIGS. 4 and 5. The descriptions of the same components as those of the first embodiment will be omitted.

A lighting device 100 according to a second embodiment comprises a board 110 having a recess 120, lead frames 133 and 143, and a light emitting device 150. The board 110 may be formed of one of poly phthal amide (PPA), poly amide 9T (PA9T), liquid crystal polymer (LCP), and syndiotactic polystyrene (SPS). Also, the board 110 may be a PCB.

As shown in FIG. 5, the lead frames 133 and 143 according to the second embodiment comprise lead frame protrusions 234 and 244 protruding toward the recess 120 (Z-axis upward direction), respectively. That is, the lead frame protrusions 234 and 244 for increasing heat dissipation areas of the lead frames 133 and 143 formed of a metal material are disposed to improve dissipation of heat generated from the light emitting device 150. As shown in FIG. 4, the lead frame protrusions 234 and 244 are arranged around the recess 120 of the board 110. The lead frames 133 and 143 may be disposed within the board 110.

As shown in FIG. 6, the lead frame protrusions 234 and 244 may comprise a plurality of protrusions. Also, the lead frame protrusions 234 and 244 may be inclined at a predetermined angle, but vertically protrude from the lead frames 133 and 143 so that the lead frame protrusions 234 and 244 may be disposed along an inclined surface of the recess 120 of the board 110.

In FIG. 6, the first lead frame protrusion 234 protruding upward from the first lead frame 133 and the second lead frame protrusion 244 protruding upward from the second lead frame 143 may be provided. That is, for example, six first lead frame protrusions 234 and four second lead frame protrusions 244 are illustrated in FIG. 6.

However, the number and configuration of the lead frame protrusions are only an example. According to a modified embodiment, a protrusion having a trunk shape as that of the first embodiment may protrude upward from the lead frame, and also, the number of protrusions may be variously changed. Also, as described in the first embodiment, a protrusion having a trunk shape may be further disposed under the lead frame.

As shown in FIG. 4, the lead frame protrusions 234 and 244 may be disposed outside a region of the recess 120 of the board 110. According to a modified embodiment, the lead frame protrusions 234 and 244 may be disposed along an inclined surface within the recess 120.

The lead frames 133 and 143 and the lead frame protrusions 234 and 244 may be formed of the same metal material as each other. As described above, the lead frames 133 and 143 and the lead frame protrusions 234 and 244 may be formed of one of metals such as Fe, Sn, Cr, Zn, Ni, Al, Ag, Au, Cu, and combinations thereof. Also, the lead frames 133 and 143 and the lead frame protrusions 234 and 244 may be formed together with the recess 120 when the board 110 is formed.

Figure 7:
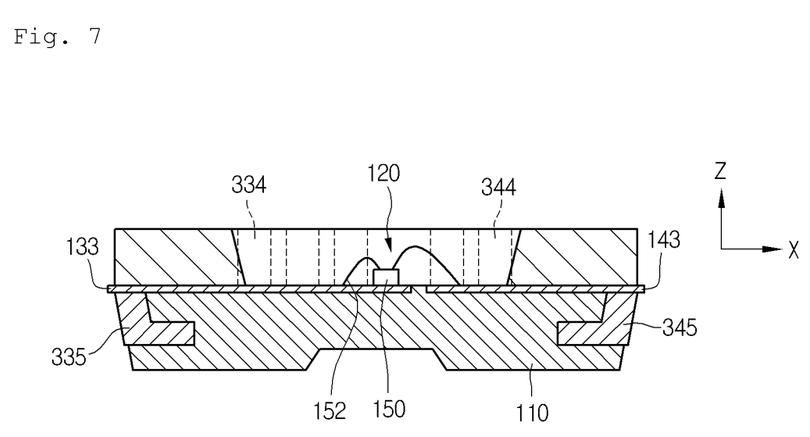
FIG. 7 is a sectional view of a lighting device according to a third embodiment.
Figure 8:
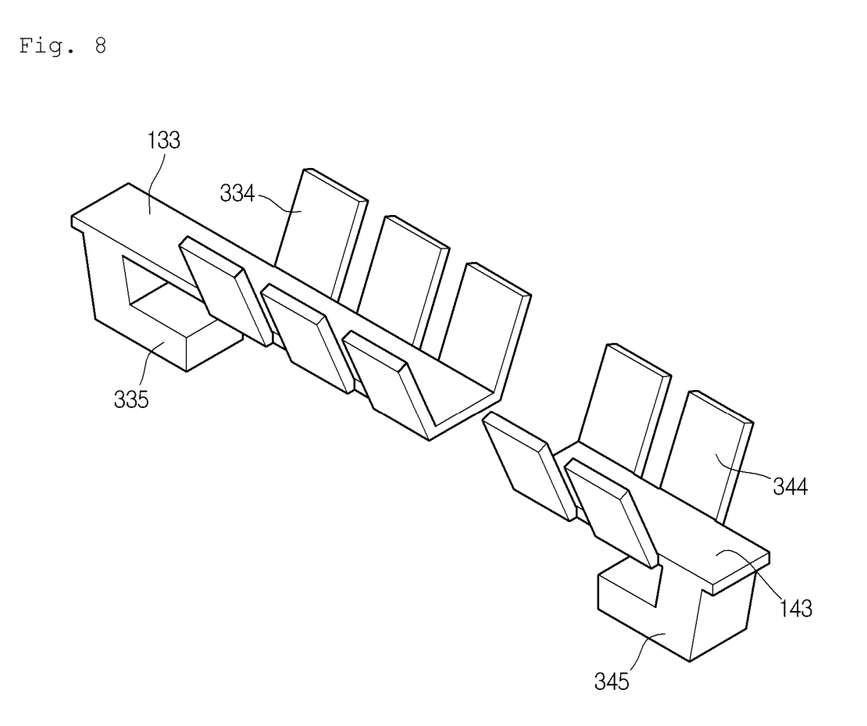
FIG. 8 is a perspective view of a lead frame of FIG. 7.

FIG. 7 is a sectional view of a light emitting device according to a third embodiment, and FIG. 8 is a perspective view of a lead frame of FIG. 7. The descriptions of the same components as those of the first and second embodiments will be omitted.

As shown in FIGS. 7 and 8, in a lighting device according to a third embodiment, lead frames 133 and 143 may comprise protrusions, respectively. The lead frame protrusions extending and protruding from the lead frames 133 and 143 comprise protrusions protruding upward and protrusions protruding downward.

That is, the protrusions extending from the lead frames 133 and 143 may comprise first lead frame protrusions 334 and 344 protruding from the lead frames 133 and 143 in a direction (a Z-axis upward direction) of a recess 120 of a board 110 and second lead frame protrusions 335 and 345 protruding from the lead frames 133 and 143 in an inner direction (a Z-axis downward direction) of the board 110. Here, since the first lead frame protrusions 334 and 344 protrude upward with respect to the board 110, the first lead frame protrusions may be referred to as lead frame upper protrusions. Also, since the second lead frame protrusions 335 and 345 protrude downward with respect to the board 110, the second lead frame protrusions 335 and 345 may be referred to as lead frame lower protrusions.

Hereinafter, for better comprehension, the first lead frame protrusions will be referred to as the lead frame upper protrusions, and the second lead frame protrusions will be referred to as the lead frame lower protrusions.

Like the second embodiment, the lead frame upper protrusions 334 and 344 may comprise a plurality of protrusions. The plurality of protrusions may be arranged around the outside of the recess 120, which is inclined at a predetermined angle.

Each of the lead frame lower protrusions 335 and 345 has an L-shape. Also, a portion of each of the lead frame lower protrusions 335 and 345 may be disposed within the board 110. To increase heat dissipation area, each of the lead frame lower protrusions 335 and 345 may have a trunk shape, like the first embodiment.

In the lead frame protrusions according to the third embodiment, since heat generated in the light emitting device 150 may be dissipated in upward and downward directions, a heat dissipation characteristic can be further improved.

The lead frames 133 and 143 and the lead frame protrusions 334, 344, 335, and 345 may be integrally formed using the same metal material. As described above, the lead frames 133 and 143 and the lead frame protrusions 334, 344, 335, and 345 may be formed of one of metals such as Fe, Sn, Cr, Zn, Ni, Al, Ag, Au, Cu, and combinations thereof.

The lighting device according to the foregoing embodiments may be variously applicable to a display device, a light unit, and a lighting system.

Figure 9:
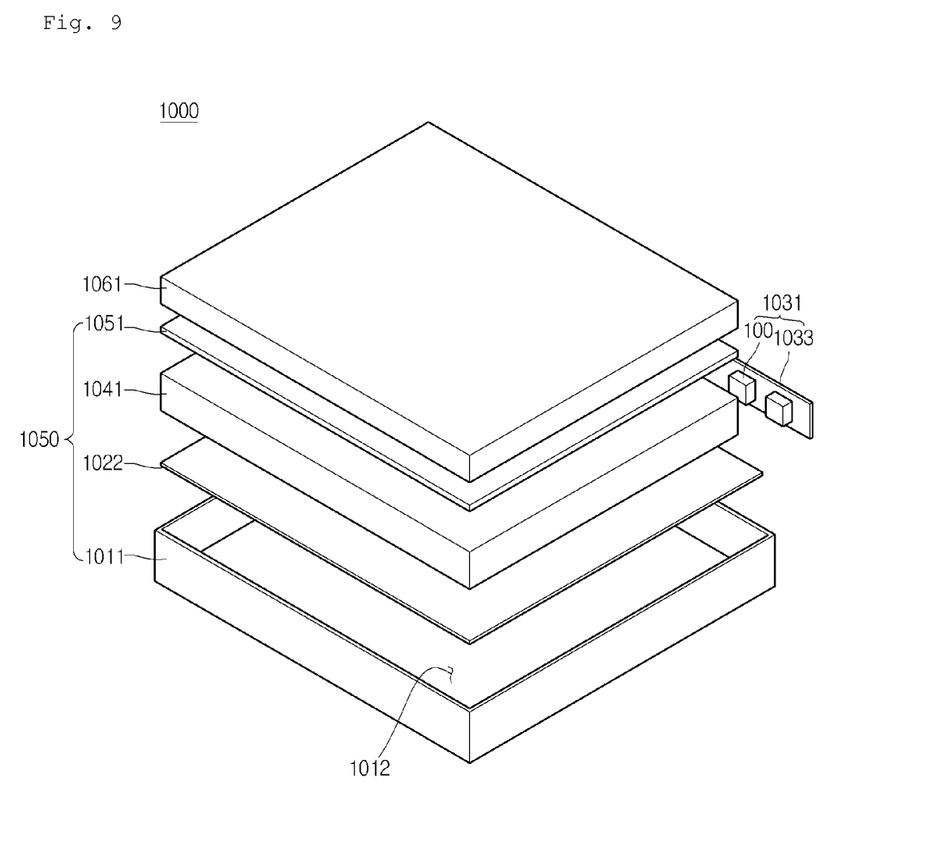
FIG. 9 is a view of a display device according to an embodiment.

FIG. 9 is an exploded perspective view of a display device according to an embodiment.

Referring to FIG. 9, a display device 1000 according to an embodiment may comprise a light guide plate 1041, a light emitting module 1031 providing light to the light guide plate 1041, a reflective member 1022 under the light guide plate 1041, an optical sheet 1051 on the light guide plate 1041, a display panel 1061 on the optical sheet 1051, and a bottom cover 1011 receiving the light guide plate 1031, the light emitting module 1031, and the reflective member 1022, but is not limited thereto.

The bottom cover 1011, the reflective member 1022, the light emitting module 1031, the light guide plate 1041, and the optical sheet 1051 may be defined as the light unit 1050.

The light guide plate 1041 diffuses light to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 provides light to at least one side surface of the light guide plate 1041. Thus, the light emitting module 1031 may be used as a light source of the display device.

At least one light emitting module 1031 may be disposed on one side surface of the light guide plate 1041 to directly or indirectly provide light. The light emitting module 1031 may comprise a board 1033 and the lighting devices 100 according to the foregoing embodiments. The lighting devices 100 may be arrayed with a predetermined distance on the board 1033. That is, the lighting devices 100 may be arrayed on the board 1033 in a chip or package form.

The board 1033 may be a printed circuit board (PCB) comprising a circuit pattern. Alternatively, the board 1033 may comprise at least one of a general PCB, a metal core PCB, and a flexible PCB, but is not limited thereto. The lighting devices 100 may be provided on a side surface of the bottom cover 1011 or on a heatsink plate, the board 1033 may be removed. Here, a portion of the heatsink plate may contact a top surface of the bottom cover 1011.

The plurality of lighting devices 100 may be provided on the board 1033 so that a light emitting surface through which light is emitted is spaced a predetermined distance from the light guide plate 1041, but is not limited thereto. A light emitting device package 200 may directly or indirectly provide light to a light incident surface that is one side surface of the light guide plate 1041, but is not limited thereto.

The reflective member 1022 may be disposed under the light guide plate 1041. Since the reflective member 1022 reflects light incident onto an under surface of the light guide plate 1041 to upwardly supply the reflected light, brightness of the light unit 1050 can be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may comprise a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel and comprise first and second boards formed of a transparent material and a liquid crystal layer between the first and second boards. A polarizing plate may be attached to at least one surface of the display panel 1061. The present disclosure is not limited to the attached structure of the polarizing plate. The display panel 1061 transmits or blocks light provided from the light emitting module 1031 to display information. The display device 1000 may be applied to various portable terminals, monitors for notebook computers, monitors for laptop computers, televisions, etc.

The optical sheet 1051 may be disposed between the display panel 1061 and the light guide plate 1041 and comprise at least one transmission sheet. For example, the optical sheet 1051 may comprise at least one of a diffusion sheet, a horizontal or vertical prism sheet, a brightness enhanced sheet, etc. The diffusion sheet diffuses incident light, and the horizontal or/and vertical prism sheet collects the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 10:
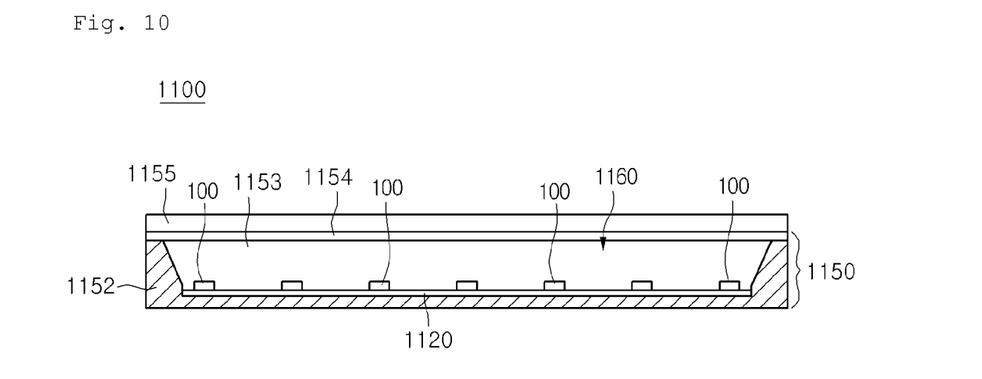
FIG. 10 is a view illustrating another example of the display device according to an embodiment.

FIG. 10 is a view illustrating another example of the display device according to an embodiment. A lighting device disclosed in FIG. 10 may have a structure in which light emitting devices are arrayed in a chip or package form.

Referring to FIG. 10, a display device 1100 comprises a bottom cover 1152, a board 1120 on which the above-described lighting devices 100 are arrayed, an optical member 1154, and a display panel 1155.

The board 1120 and the lighting devices 100 may be defined as a light emitting module 1060. The bottom cover 1152, at least one light emitting module 1060, and the optical member 1154 may be defined as a light unit. The light emitting devices may be arrayed on the board 1129 in a chip or package form.

The bottom cover 1152 may comprise a receiving part 1153, but is not limited thereto.

Here, the optical member 1154 may comprise at least one of a lens, a light guide plate, a diffusion sheet, horizontal and vertical prism sheets, and a bright enhancement sheet. The light guide plate may be formed of a PC material or a PMMA material. In this case, the light guide plate may be removed. The diffusion sheet diffuses incident light, and the horizontal and vertical prism sheets concentrate the incident light into a display region. The brightness enhanced sheet reuses lost light to improve brightness.

Figure 11:
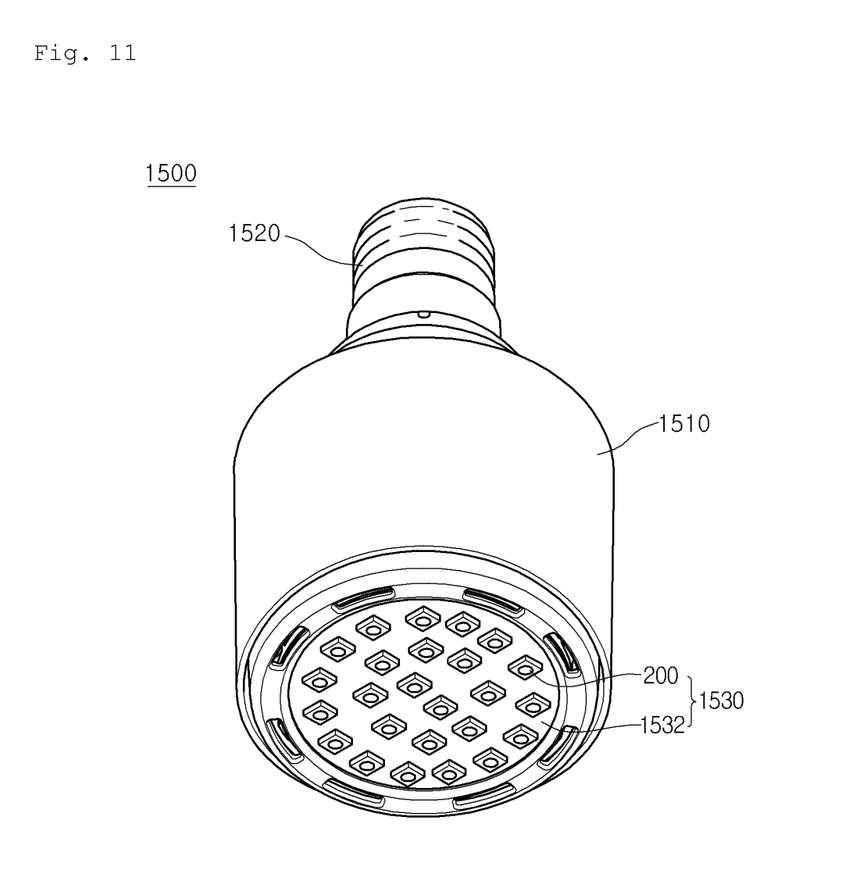
FIG. 11 is a view of a lighting system according to another embodiment.

FIG. 11 is a view of a lighting system according to an embodiment.

Referring to FIG. 11, a lighting system 1500 may comprise a case 1510, a light emitting module 1530 disposed in the case 1510, and a connection terminal 1520 disposed in the case 1510 to receive an electric power from an external power source.

The case 1510 may be formed of a material having a good heat dissipation characteristic, for example, a metal material or a resin material.

The light emitting module 1530 may comprise a board 1532 and a lighting device 200 provided on the board 1532. The lighting device 200 may be provided in plurality, and the plurality of lighting device 200 may be arrayed in a matrix shape or spaced a predetermined distance from each other. Also, light emitting devices may be arrayed on the board 1532 in a chip or package form.

The board 1532 may be an insulator on which a circuit pattern is printed. For example, the board 1532 may comprise one of a general printed circuit board (PCB), a metal core PCB, a flexible PCB, and a ceramic PCB, etc.

Also, the board 1532 may be formed of a material, which efficiently reflects light. Alternatively, a surface of the board 1532 may be a layer coated with a color, which efficiently reflects light, for example, a white color or a silver color.

At least one lighting device 200 may be provided on the board 1532. Each of the lighting devices 200 may comprise at least one light emitting diode (LED) chip. The LED chip may comprise a color LED emitting red, green, blue or white light, and a UV LED emitting ultraviolet (UV) rays.

The light emitting module 1530 may have combinations of various lighting devices 200 to obtain desired color and luminance. For example, the light emitting module 1530 may have combinations of a white LED, a red LED, and a green LED to obtain a high color rendering index (CRI).

The connection terminal 1520 may be electrically connected to the light emitting module 1530 to supply a power. The connection terminal 1520 may be screw-fitted into and coupled to an external power source in a socket type, but is not limited thereto. For example, the connection terminal 1520 may be made in a pin type and inserted into the external power source, or may be connected to the external power source through a wire.

In the lighting device and the lighting system having the same according to the embodiments, heat generated in the light emitting device may be effectively dissipated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
a board having a first recess and a second recess;
a lead frame comprising a first lead frame and a second lead frame electrically disconnected from the first lead frame; and
a light emitting device disposed on the lead frame,
wherein the lead frame further comprises:
 a first lead frame protrusion downwardly protruding from a bottom surface of the first lead frame and disposed in the first recess, the first lead frame protrusion extending under the light emitting device;
 a second lead frame protrusion downwardly protruding from a bottom surface of the second lead frame and disposed in the second recess; and
 a third lead frame protrusion upwardly protruding from one of the first lead frame and the second lead frame,
wherein the board comprises a third recess on a top surface thereof, the third recess having a predetermined depth,
wherein the third recess exposes a top surface of the first lead frame and a top surface of the second lead frame, and
wherein the third lead frame protrusion protrudes toward the third recess.

2. The lighting device of claim 1, wherein the third lead frame protrusion is disposed along a circumference of an inner inclined surface of the third recess.

3. The lighting device of claim 1, wherein the third lead frame protrusion comprises a plurality of protrusions including a first protrusion and a second protrusion, the first protrusion extending upwardly from a first side of the first lead frame and the second protrusion extending upwardly from a second side of the first lead frame, the first protrusion and the second protrusion facing each other.

4. The lighting device of claim 1, wherein each of the first lead protrusion and the second lead frame protrusion has side and bottom surfaces surrounded by the board.

5. The lighting device of claim 1, wherein the lead frame is disposed within the board.

6. The lighting device of claim 1, wherein each of the first lead frame protrusion and the second lead frame protrusion is spaced apart from a side surface of the board and a bottom surface of the board by a distance of about 50 µm to about 100 µm.

7. The lighting device of claim 1, wherein the first lead frame protrusion, the second lead frame protrusion, and the third lead frame protrusion are formed of the same material.

8. The lighting device of claim 1, wherein the first recess is spaced apart from the second recess, and wherein the board includes a first portion under the first lead frame protrusion, a second portion under the second lead frame protrusion, and a third portion between the first portion and the second portion, the third portion having a thickness greater than a thickness of the first portion.

9. A lighting device comprising:
a board;
a light emitting device disposed on the board; and
a lead frame electrically connected to the light emitting device,
wherein the lead frame comprises a base frame, a first lead frame protrusion protruding upward from the base frame, and a second lead frame protrusion protruding downward from the base frame,
wherein the second lead frame protrusion includes a first portion exposed to the outside of the board and extending downward from the base frame and a second portion connected to the first portion and inserted into the board, a bottom surface of the second portion disposed under the base frame and being parallel to a bottom surface of the base frame, wherein each of the first portion and the second portion has a thickness greater than a thickness of the base frame,
wherein the board comprises a recess on a top surface thereof, the recess having a predetermined depth,
wherein the recess exposes a top surface of the first lead frame and a top surface of the second lead frame, and
wherein the first lead frame protrusion protrudes toward the recess.

10. The lighting device of claim 9, wherein the first lead frame protrusion comprises a plurality of protrusions extending upward from the lead frame.

11. The lighting device of claim 9, wherein the second lead frame protrusion has an L-shape.

12. The lighting device of claim 9, wherein the first lead frame protrusion and the second lead frame protrusion are formed of the same material.

13. A lighting system comprising:
a case;
a light emitting module disposed in the case, the light emitting module comprising at least one lighting device; and
a connection terminal disposed in the case and receiving a power from an external power source,
the lighting device further comprising:
a board having a first recess and a second recess;
a lead frame comprising a first lead frame;
a second lead frame electrically disconnected from the first lead frame; and
a light emitting device disposed on the lead frame,
wherein the lead frame further comprises:
a first lead frame protrusion downwardly protruding from a bottom surface of the first lead frame and disposed in the first recess, the first lead frame protrusion extending under the light emitting device;
a second lead frame protrusion downwardly protruding from a bottom surface of the second lead frame and disposed in the second recess; and
a third lead frame protrusion upwardly protruding from one of the first lead frame and the second lead frame,
wherein the board comprises a third recess on a top surface thereof, the third recess having a predetermined depth,
wherein the third recess exposes a top surface of the first lead frame and a top surface of the second lead frame, and
wherein the third lead frame protrusion protrudes toward the third recess.

14. The lighting system of claim 13, wherein the third lead frame protrusion is disposed along a circumference of an inner inclined surface of the third recess.

15. The lighting system of claim 13, wherein the third lead frame protrusion comprises a plurality of protrusions including a first protrusion and a second protrusion, the first protrusion extending upwardly from a first side of the first lead frame and the second protrusion extending upwardly from a second side of the first lead frame, the first protrusion and the second protrusion facing each other.

16. The lighting system of claim 13, wherein the lead frame is disposed within the board.

17. The lighting system of claim 13, wherein each of the first lead frame protrusion and the second lead frame protrusion has side and bottom surfaces surrounded by the board.

18. The lighting system of claim 13, wherein each of the first lead frame protrusion and the second lead frame protrusion is spaced apart from a side surface of the board and a bottom surface of the board by a distance of about 50 µm to about 100 µm.

19. The lighting system of claim 13, wherein the first lead frame protrusion, the second lead frame protrusion, and the third lead frame protrusion are formed of the same material.

20. The lighting system of claim 13, wherein the first recess is spaced apart from the second recess, and wherein the board includes a first portion under the first lead frame protrusion, a second portion under the second lead frame protrusion, and a third portion between the first portion and the second portion, the third portion having a thickness greater than a thickness of the first portion.

* * * * *